US009689903B2

(12) United States Patent
Sharma et al.

(10) Patent No.: US 9,689,903 B2
(45) Date of Patent: Jun. 27, 2017

(54) APPARATUS AND METHODS FOR MEASURING CURRENT (71) Applicant: Analog Devices, Inc., Norwood, MA (US)

(72) Inventors: Yogesh Jayaraman Sharma, Santa Clara, CA (US); Nathan R. Carter, Santa Clara, CA (US); Teera Songatikamas, San Jose, CA (US); Brendan Cronin, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/457,560

(22) Filed: Aug. 12, 2014

(65) Prior Publication Data
US 2016/0047846 A1 Feb. 18, 2016

(51) Int. Cl.
G01R 33/02 (2006.01)
G01R 15/20 (2006.01)
G01R 33/09 (2006.01)

(52) U.S. Cl.
CPC ......... *G01R 15/207* (2013.01); *G01R 15/202* (2013.01); *G01R 15/205* (2013.01); *G01R 33/096* (2013.01)

(58) Field of Classification Search
CPC .. G01R 33/096; G01R 15/207; G01R 15/202; G01R 15/205

(Continued)

(56) References Cited

U.S. PATENT DOCUMENTS 5,422,566 A * 6/1995 Boenning ............ G01R 15/148
324/117 R
5,473,244 A * 12/1995 Libove .................... G01R 1/22
324/126

(Continued)

FOREIGN PATENT DOCUMENTS

CH  EP 2202527 A1 * 6/2010 ........... G01R 15/202
CN    103487632 A    1/2014

(Continued)

OTHER PUBLICATIONS

Kaine-Krolak, "An Introduction to Infrared Technology: Applications in the Home, Classroom, Workplace, and Beyond . . . ", 1995, trace.wisc.edu.*

(Continued)

*Primary Examiner* — Patrick Assouad
*Assistant Examiner* — Sean Curtis
(74) *Attorney, Agent, or Firm* — Knobbe, Martens, Olson & Bear, LLP (57) ABSTRACT

In an embodiment, a body of apparatus includes an opening, such as a V-shaped jaw, that deterministically locates a position of a wire in at least one dimension when the wire is placed in the opening. The apparatus also includes a plurality of sensors. At least one differential signal can be generated from signals from magnetic sensors, such as anisotropic magnetoresistance (AMR) sensors, of the plurality of sensors to cancel out common mode interference. An additional sensor of the plurality of sensors provides an output from which the location of the wire in another dimension is determined. The current flowing through the wire can be derived from at least the at least one differential signal and the location of the wire the other dimension.

25 Claims, 5 Drawing Sheets (58) Field of Classification Search
USPC ......... 324/249, 207.13, 207.14, 207.22, 219, 324/228, 247, 117 R, 126
See application file for complete search history.

(56) References Cited

U.S. PATENT DOCUMENTS

| | | | | |
|---|---|---|---|---|
| 5,717,326 | A * | 2/1998 | Moriwaki | G01R 15/18 324/117 H |
| 5,767,668 | A * | 6/1998 | Durand | G01R 31/2844 324/117 R |
| 6,252,389 | B1 * | 6/2001 | Baba | G01R 15/202 324/117 H |
| 7,164,263 | B2 * | 1/2007 | Yakymyshyn | G01R 15/207 324/117 H |
| 7,719,258 | B2 * | 5/2010 | Chen | G01R 15/202 324/117 H |
| 8,400,138 | B2 * | 3/2013 | Cooper | G01R 15/181 324/117 R |
| 8,922,194 | B2 * | 12/2014 | Blake | G01R 33/032 324/96 |
| 2003/0112006 | A1 * | 6/2003 | Luetzow | G01D 5/145 324/207.21 |
| 2008/0077336 | A1 * | 3/2008 | Fernandes | G01R 15/142 702/57 |
| 2011/0248711 | A1 * | 10/2011 | Ausserlechner | G01R 15/207 324/251 |
| 2012/0187937 | A1 * | 7/2012 | Blake | G01R 33/032 324/96 |
| 2012/0290240 | A1 * | 11/2012 | Fukui | G01R 15/20 702/65 |
| 2013/0033260 | A1 * | 2/2013 | Nomura | G01R 15/207 324/252 |
| 2013/0106400 | A1 * | 5/2013 | Cheng | G01R 15/20 324/117 R |
| 2013/0285825 | A1 * | 10/2013 | Peczalski | G01R 33/07 340/664 |
| 2014/0028308 | A1 * | 1/2014 | Ogomi | G01R 33/096 324/252 |
| 2014/0347036 | A1 * | 11/2014 | Noh | G01R 15/183 324/126 |
| 2015/0016006 | A1 * | 1/2015 | van Vroonhoven | H01F 13/006 361/149 |
| 2015/0042320 | A1 * | 2/2015 | Cadugan | G01R 33/06 324/207.2 |
| 2015/0316623 | A1 * | 11/2015 | Romero | G01R 33/077 324/251 |
| 2015/0331072 | A1 * | 11/2015 | Ogawa | G01R 33/1253 324/252 |
| 2015/0338473 | A1 * | 11/2015 | Diaconu | G01R 33/0029 324/251 |

FOREIGN PATENT DOCUMENTS

| | | | | |
|---|---|---|---|---|
| EP | 1 037 056 | A1 | 9/2000 | |
| EP | 1037056 | A1 * | 9/2000 | |
| EP | 2 202 527 | A1 | 6/2010 | |
| EP | 2202527 | A1 * | 6/2010 | |
| JP | 09-308615 | A * | 12/1997 | ............ G01R 33/02 |
| JP | 09308615 | A * | 12/1997 | |
| JP | EP 1037056 | A1 * | 9/2000 | ............ G01R 15/14 |
| JP | 2012-098205 | A | 5/2012 | |
| PL | WO 2011154157 | A1 * | 12/2011 | ........... G01R 15/183 |
| WO | WO 2011154157 | A1 * | 12/2011 | |
| WO | WO 2013/099504 | A1 | 7/2013 | |

OTHER PUBLICATIONS

Rogowski Coil, Wikipedia Entry, http://en.wikipedia.org/wiki/Rogowski_coil (accessed Nov. 14, 2014), 5 pages.

* cited by examiner

APPARATUS AND METHODS FOR MEASURING CURRENT

BACKGROUND

Field

The described technology generally relates to measuring current and, more specifically, to apparatus and methods for sensing and/or measuring current flowing through a wire.

Description of the Related Art

Accurate measurement of current through a wire remotely (e.g., without breaking the wire or coming into contact with it) is useful for diagnostic, operational, and protection purposes in many applications, such as industrial and automotive applications. In particular, accurate current measurement without precise control of the placement of the wire may present various challenges. It can also be challenging to accurately measure current through the wire remotely when there are other current carrying wires located nearby, as the current flowing though such wires can interfere with the desired current measurement. One commonly used technique for alternating current (AC) measurements is using a Rogowski coil, which does not depend on the precise location of the wire inside the coil. However, Rogowski coils cannot make direct current (DC) measurements and can be too bulky for use in tight spaces.

SUMMARY

The methods and devices of the described technology each has several aspects, no single one of which is solely responsible for its desirable attributes.

One embodiment includes an apparatus for measuring current flowing through a wire, and the apparatus comprises a housing with an opening configured to receive the wire and to define a location of a point of the wire in a first dimension when the wire is positioned in the opening, two magnetic sensors within the housing positioned on opposing sides of the opening in the first dimension, another one or more sensors, and a processor in communication with the two magnetic sensors and the another one or more sensors. The processor is configured to generate a differential signal indicative of a difference between outputs of the two magnetic sensors, determine a location of the point of the wire in a second dimension based on an output of the another one or more sensors, and derive a measure of the current flowing through the wire based on the differential signal and the determined location of the point of the wire in at least the second dimension.

Another embodiment includes an apparatus for measuring current flowing through a wire, and the apparatus comprises a body with an opening configured to receive and fix a horizontal position of the wire when the wire is positioned in the opening, two magnetic sensors positioned on opposing horizontal sides of the opening, at least one vertical position sensor configured to measure a vertical position of the wire when the wire is positioned in the opening, and a processor in communication with the two magnetic sensors and the at least one vertical position sensor, the processor configured to calculate a current flowing through the wire based on outputs of the two magnetic sensors and the at least one vertical position sensor.

Another embodiment includes a method for measuring current through a wire, and the method comprises generating a differential signal indicative of a difference between outputs of two magnetic sensors positioned on opposing sides of the wire in a first dimension, determining a location of a point of the wire in a second dimension based on an output of another one or more sensors, and deriving a measure of the current flowing through the wire based on the differential signal and the determined location of the point of the wire in the second dimension.

BRIEF DESCRIPTION OF THE DRAWINGS

These drawings and the associated description herein are provided to illustrate specific embodiments of the described technology and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

A current carrying wire generates a magnetic field in the orthogonal plane to the direction of current flow. A measurement of the magnetic field can be used to infer the magnitude of the current flowing in the wire. Hall Effect sensors can be used to measure magnetic fields using the Lorentz effect. Anisotropic magnetoresistive (AMR) sensors can measure the magnetic field based on the change in resistivity that is proportional to the perpendicular magnetic field. By using magnetic sensors, such as Hall Effect sensors and/or AMR sensors, certain challenges related to measuring current through a wire can be overcome according to aspects of this disclosure. For instance, embodiments described herein can overcome challenges related to the magnetic field interference from nearby current carrying wires. As another example, embodiments described herein can overcome challenges related to a location of the current carrying wire not being fixed. Since magnetic field strength should drop off inversely with distance from the current carrying wire, the distance from the wire can have a significant impact on inferring the current flowing through the wire using magnetic sensors. Furthermore, using certain magnetic sensors, such as Hall Effect and/or AMR sensors, apparatus disclosed herein can generate outputs that can be used to accurately make both alternating current (AC) and direct current (DC) measurements.

A body of an apparatus may include an opening that may deterministically locate a wire in at least a first dimension when the wire is placed in the opening. The apparatus may also include a plurality of sensors. At least one differential signal may be generated from signals from the magnetic sensors on opposing sides of the opening. Accordingly, common mode interference can be substantially canceled in the differential signal. Outputs of another one or more sensors can be used to determine the location of the wire in a second dimension. As such, the position of the wire within the opening can be precisely known in both the first dimension and the second dimension. The current flowing through the wire can be accurately derived from the at least one differential signal and the location of the wire in at least the second dimension.

Figure 1:
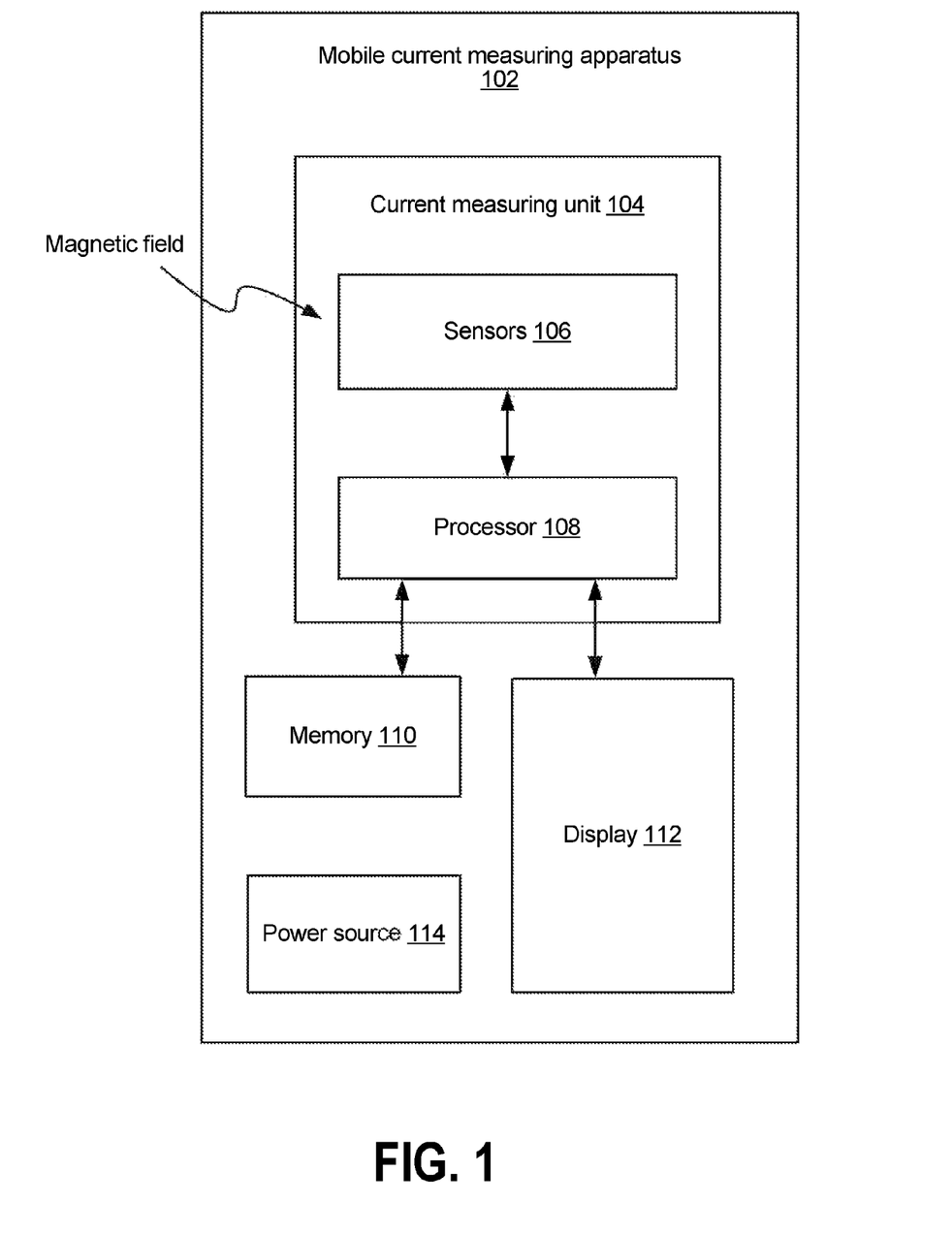
FIG. 1 is a block diagram illustrating an example current measurement system.

Referring to FIG. 1, a block diagram illustrating an example current measurement system will be described. The illustrated system includes a mobile current measuring apparatus 102, having a current measuring unit 104, memory 110, a display 112, and power source 114. The current measuring unit 104 in turn may include sensors 106 and a processor 108. The sensors 106 are configured to sense, for example, the differential magnetic field generated by current flowing through a wire. Embodiments of the current measuring unit 104 will be described in further detail in connection with FIGS. 2A-3 below. In some embodiments, some or all of the memory 110, display 112, and the power source 114 may reside in the same integrated unit as the sensors 106 and the processor 108.

The memory 110 may be a non-transitory machine-readable storage medium such as a RAM, ROM, EEPROM, etc. The memory 110 may be in communication with the processor 108, which may read from or write to the memory 110. The display 112 may be configured to show the result of the current measurement performed in accordance with the disclosures herein. The display 112 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the display 112. The power source 114 may provide power to substantially all components of the system of FIG. 1. In some implementations, the power source 114 may be one or more battery units.

Figure 2A:
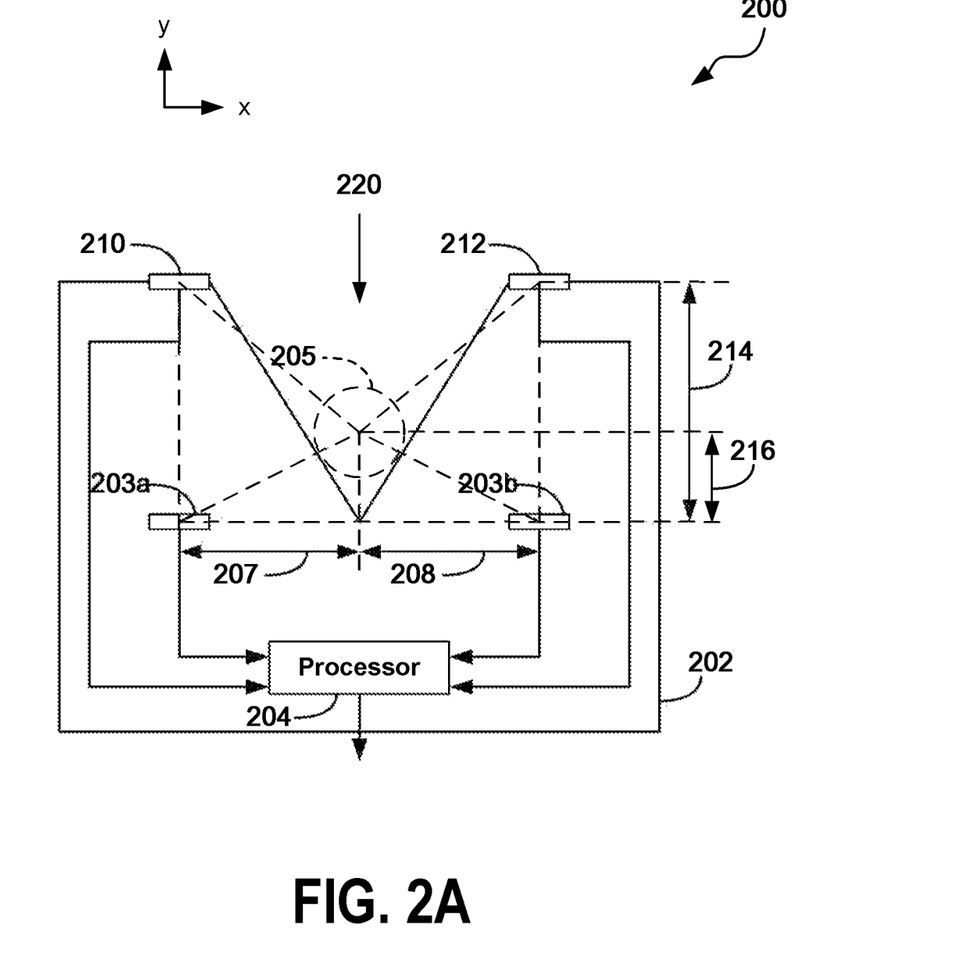
FIG. 2A is a cross-sectional diagram illustrating an example apparatus for measuring current in accordance with one embodiment.

Referring to FIG. 2A, a cross-sectional diagram illustrating an example apparatus for measuring current will be described. The illustrated apparatus 200 can implement the current measuring unit 104 (FIG. 1). The illustrated apparatus 200 includes magnetic sensors 203a, 203b, and a processor 204. The magnetic sensors 203a, 203b, and a processor 204 can implement the sensors 106 and the processor 108 of FIG. 1, respectively. The apparatus 200 may also include a body 202, and secondary or vertical position sensors 210, 212, which may be interchangeably referred to herein as secondary sensors or vertical position sensors. The sensors 106 of FIG. 1 can also include the secondary sensors 210, 212.

The body 202 may be a housing formed from one or more of various manufacturing processes, including injection molding and vacuum forming, for example. The body 202 may be made from one or more of various materials, including but not limited to plastic, glass, metal, ceramic, and rubber. The body 202 may include various colored or designed portions including different logos, symbols, marks, or pictures. The body 202 may include an opening 220 configured to receive a wire 205. The wire 205 is typically not considered part of the apparatus 200. The body 202 can provide a housing to encase the magnetic sensors 203a, 203a, the secondary sensors 210, 212, and the processor 204. Accordingly, the apparatus 200 can be a relatively small integrated unit. The body 202 can include an output contact to provide an indication of current flowing through a wire.

The opening 220 may comprise a sloped recess that may contact the wire 205 at one or more contact points and/or surfaces when the wire 205 is positioned within the opening 220. The illustrated opening 220 narrows as it extends into the body 202. The opening 220 may be implemented to locate the wire 205 deterministically in at least one dimension when the wire 205 is firmly placed in the opening 220. The wire 205, for example, can be firmly placed in the opening 220 by a user pushing the wire 205 against the opening 220. The opening 220 can be any suitable shape to deterministically define a position of the wire 205 in at least one dimension, such as a horizontal position. For instance, at least a portion of the opening 220 can be substantially V-shaped. As illustrated, the opening 220 may be a symmetric V-shaped jaw. Furthermore, the magnetic sensors 203a, 203b may be on the opposing sides of and approximately equidistance from the axis of symmetry of the V-shaped jaw so that respective distances 207 and 208 from the center point of the wire 205 to the magnetic sensors 203a and 203b may be approximately equal. In such embodiments, regardless of the thickness of the wire 205, the center point of the wire 205 may be located approximately at the midpoint between the magnetic sensors 203a and 203b in a first dimension (e.g., the horizontal or x-dimension in FIG. 2A). Depending on the thickness of the wire 205, the location of the wire 205 in a second dimension (e.g., the vertical or y-dimension in FIG. 2A) may not be the same for differently sized wires. Each wire 205 positioned within the opening 220 can have a fixed position in at least one dimension, even though the fixed position for a particular wire can be different than a fixed position for a differently dimensioned wire. The location of the wire 205 in a second dimension can be expressed as a vertical distance 216 between a point of the wire 205 (e.g., a center point) and the location of the magnetic sensors 203a, 203b in the second dimension. As illustrated, the second dimension can be orthogonal to the first dimension. It is to be noted that the horizontal and vertical dimensions or the x-, y-, and z-dimensions referred to herein denote orthogonal dimensions relative to one another and are not related to any absolute orientations, gravitational or otherwise. The vertical distance 216 may be determined with the processor 204 based on data from the secondary or vertical position sensors 210, 212 in conjunction with data from the magnetic sensors 203a, 203b as further discussed below.

In some embodiments, the opening 220 may be a non-symmetric V-shaped jaw. In some other embodiments, the opening 220 may include a V-shaped portion and a non-V-shaped portion of the opening 220 may be curved or smoothened, for example, so that no acute angle or sharp edges may be present. In some other embodiments, the opening 220 may comprise a recess with a non-constant slope (e.g., concave up or down) to accommodate various widths of the wire 205. Accordingly, the computation for deterministically locating the wire 205 may be modified from the disclosed implementations according to known or predetermined characteristics (e.g., shape, slope, curvature, symmetry, location or orientation relative to the sensors, etc.) of the opening 220.

Figure 2B:
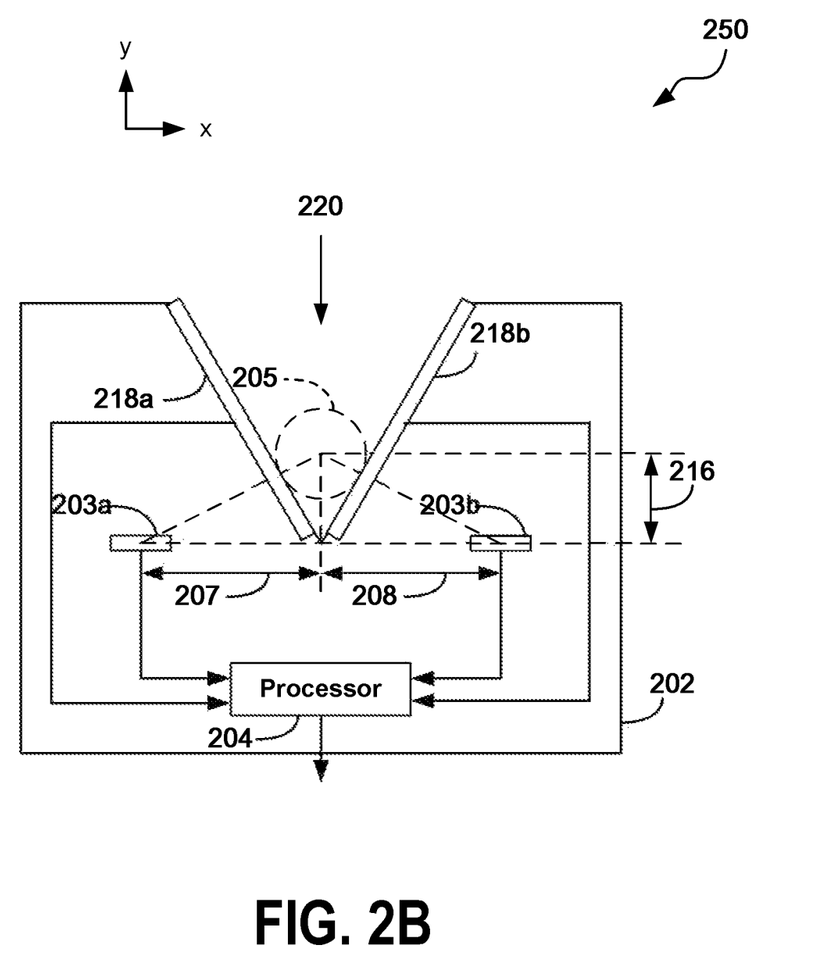
FIG. 2B is a cross-sectional diagram illustrating an example apparatus for measuring current in accordance with another embodiment.

The opening 220 as described above can be advantageous for a current measuring apparatus in various ways. For instance, instead of having one or more mechanical moving parts to fasten the wire in a position, the opening 220 allows the user to simply push the wire 205 against the opening 220. Not including a mechanical part to place the wire in position can be advantageous because inaccuracies resulting from moving parts can be eliminated and/or potential maintenance issues for the moving parts can be avoided. Moreover, implementing the current measurement system without moving parts can reduce costs relative to similar systems that include moving parts. Furthermore, the opening 220 with a widening structure as illustrated in FIGS. 2A and 2B allows the current measuring apparatus to accommodate for wires of various thicknesses, allowing the current measuring apparatus to be more adaptive and versatile. The forgoing descriptions of the opening 220 discuss only a few illustrative examples, and the opening 220 may be implemented in various ways that allow deterministic derivation of the location of the wire 205 in at least one dimension.

The magnetic sensors 203a, 203b may be magnetic sensors configured to detect the magnetic field around the wire 205. The magnetic sensors 203a, 203b may be located on opposing sides of the opening 220 in the first dimension (e.g., the horizontal or x-dimension in FIGS. 2A-2B). As such, the magnetic sensors 203a, 203b will be on opposing sides of a wire 205 positioned within the opening 220. In some embodiments the magnetic sensors 203a, 203b may be magnetoresistive (MR) sensors, such as anisotropic magnetoresistive (AMR) sensors, or Hall Effect sensors. AMR sensors can be relatively small compared to other types of magnetic sensors, such as Rogowski coils. Accordingly, AMR sensors can be used in relatively small current sensing equipment, which can make measurements in hard to reach areas. The magnetic sensors 203a, 203b may comprise magneto-resistive materials whose electrical resistance varies according to an external magnetic field. In some embodiments, the magnetic sensors 203a, 203b may be positioned in the orientation that would allow detecting the magnetic field in a plane orthogonal to the direction of current flowing through the wire 205. The magnetic sensors 203a, 203b may be configured to generate measurement signals and send the signals to the processor 204. Processing of the signals from the magnetic sensors 203a, 203b will be discussed further below.

The secondary sensors 210, 212 may be configured to detect the magnetic field around the wire 205 to determine the location of the wire 205 in the second dimension (e.g., the vertical or y-dimension in FIG. 2A). The secondary sensors 210, 212 and the magnetic sensors 203a, 203b may be located on the opposing sides of the wire 205 to be received in the opening 220 in the second dimension. The secondary sensor 210 and the secondary sensor 212 may also be located on the opposing sides of the opening 220 in the first dimension such that the secondary sensors 210 and 212 are on opposing sides of a wire 205 positioned within the opening 220. In some embodiments, the first magnetic sensor 203a and the first secondary sensor 210 can be on an opposite sides of the opening 220 in the first dimension than the second magnetic sensor 203b and the second secondary sensor 212. Such an arrangement may be advantageous for canceling out common interference measured by the sensor pairs as further described below. As illustrated, the first magnetic sensor 203a and the first secondary sensor 210 can be aligned along the second dimension. In some embodiments, both the magnetic sensors 203a, 203b and the secondary sensors 210, 212 can be MR sensors, such as AMR sensors. When the magnetic sensors 203a, 203b are AMR sensors, implementing the secondary sensors 210, 212 as AMR sensors can be relatively inexpensive. Furthermore, AMR sensors can be relatively small and an integrated unit with the magnetic sensors 203a, 203b and the secondary sensors 210, 212 as AMR sensors within the body 202 can be relatively compact. Such a relatively compact integrated unit can be measure current flowing through a wire when a wire is located in a small or difficult to reach place. In some embodiments, the secondary sensors 210, 212 may be positioned in the orientation that detects the magnetic field in a plane orthogonal to the direction of the current flowing through the wire 205. Signals generated by the secondary sensors 210, 212 may be communicated to the processor 204 to determine the position of the wire 205 in the second dimension, which will be discussed further below.

The processor 204 may be in communication with the magnetic sensors 203a, 203b and the secondary sensors 210, 212. The processor 204 can derive a measure of current flowing through the wire 205 positioned in the opening 220. The processor 204 can derive the measure of current flowing through the wire 205 based on outputs of the magnetic sensors 203a, 203b, and the secondary sensors 210, 212. For instance, the processor 204 can derive a measure of current flowing through the wire 205 based on a differential signal generated from the outputs of the magnetic sensors 203a, 203b and a location (e.g., the y-dimension location) of a point (e.g., center) of the wire 205 determined based on signals from the secondary or vertical position sensors 210, 212. In another example, the processor 204 can determine a distance between at least one of the magnetic sensors 203a, 203b and the point of the wire 205 to derive the measure of the current flowing through the wire 205. In some instances, the processor 204 can derive the measure of current flowing through the wire 205 based on calculated distances from at least two of the magnetic sensors 203a, 203b, and the secondary sensors 210, 212.

The processor 204 may be configured to receive measurement signals from the magnetic sensors 203a, 203b to generate a differential signal. Each of the signals from the magnetic sensors 203a, 203b may include interference from the environment, such interference from magnetic fields generated by other wires nearby. Since the magnetic sensors 203a, 203b may be located relatively near to each other on the opposing sides of the wire 205, apart from each other by approximately the maximum thickness of a wire the body 202 is configured to receive, the interference included in each of the signals from the magnetic sensors 203a, 203b may be approximately equal to each other. This common mode interference in the signals from the magnetic sensors 203a, 203b may be cancelled out by generating the differential signal from a difference between the two signals from the magnetic sensors 203a, 203b. In an embodiment in which the distances 207 and 208 are approximately equal to each other, the differential signal from the magnetic sensors 203a, 203b in conjunction with data from the secondary sensors 210, 212 may be used to determine the current flowing through the wire 205 without expressly calculating the location of the wire in the first dimension (e.g., the horizontal or x-dimension in FIG. 2A).

For example, when the magnetic sensors 203a, 203b and the secondary sensors 210, 212 are AMR sensors, the magnetic field measurements from the magnetic sensors 203a, 203b and the secondary sensors 210, 212 may be expressed in terms of the location of the center of the wire in the second dimension and the current flowing through the wire based on the relationship between the magnetic flux intensity and the current flowing through the wire 205 and the anisotropic characteristics of the magnetic sensors 203a, 203b, and the secondary sensors 210, 212 in some implementations. In general, magnetic flux intensity may be expressed as follows:

$$H = \frac{I}{2\pi r} \quad \text{(Equation 1)}$$

where H is magnetic flux intensity, I is current flowing through a wire (e.g., the wire 205), and r is the distance between the center of the wire and a sensor (e.g., the center of the wire 205 and one of the sensors 203a, 203b, 210, 212) assuming that the wire is infinitely long in the z-dimension (coming out of the page in FIG. 2A, for example). The infinitely long wire assumption may provide a reasonable approximation when the wire 205 is straight without bending in the z-dimension for at least about 10 times the distance between the sensors, for example. When the magnetic sensors 203a, 203b and the secondary sensors 210, 212 are implemented with anisotropic sensors, the sensors 203a, 203b, 210, 212 may be positioned so that only the proportion of the magnetic flux intensity in the second dimension (e.g., the y-dimension in FIG. 2A) may be sensed. The magnetic sensors 203a, 203b can be oriented so that they are sensitive to opposite directions, and the secondary sensors 210, 212 may be oriented so that they are sensitive to opposite directions both in the second dimension (e.g., the y-dimension in FIG. 2A). In this implementation, the differential signals from the sensors 203a, 203b, 210, 212 would sum the magnetic flux components in the second dimension (e.g., the y-dimension in FIG. 2A), and the magnetic flux intensity for one sensor may be expressed as follows:

$$H = \frac{I}{2\pi r} \cos\phi \quad \text{(Equation 2)}$$

where $\Phi$ is the angle between the direction of the flux intensity and the critical direction (i.e., the direction in which the anisotropic sensor is sensitive to) of the sensor (e.g., the sensors 203a, 203b, 210, 212). Since the direction of the magnetic flux is perpendicular to the radial distance r from the wire to the sensor (e.g., the center of the wire 205 and one of the sensors 203a, 203b, 210, 212), and the critical direction is in the second dimension (e.g., the y-dimension in FIG. 2A), cos $\Phi$ may be expressed as $$\frac{a}{r}$$

where a is the first dimension distance between one of the sensors and the wire (e.g., the distance 207 or 208). Therefore, substituting $$\frac{a}{r}$$

for cos $\Phi$ in Equation 2, the differential signal from the magnetic sensor pairs (e.g., 203a and 203b, or 210 and 212) can be expressed in general as below:

$$H = \frac{Ia}{2\pi r^2} + \frac{Ia}{2\pi r^2} = \frac{Ia}{\pi r^2} \quad \text{(Equation 3)}$$

Using the Pythagorean theorem to substitute $r^2$, the differential signals from the magnetic sensors 203a and 203b can be expressed as below:

$$H_1 = \frac{Ia}{\pi(a^2 + b^2)} \quad \text{(Equation 4)}$$

where $H_1$ is the differential signal from the magnetic sensors 203a, 203b and b is the second dimension distance between the sensors and the wire (e.g., the distance 216). Similarly, the differential signal from the secondary sensors 210, 212 may be expressed as below:

$$H_2 = \frac{Ia}{\pi(a^2 + (c-b)^2)} \quad \text{(Equation 5)}$$

where $H_2$ is the differential signal from the secondary sensors 210, 212, and c is the second dimension distance between the sensors (e.g., the distance 214). Based on the obtained differential sensor data corresponding the magnetic flux intensities (i.e., $H_1$ and $H_2$) and a priori knowledge of the distances a (e.g., 207 or 208) and c (e.g., 214), Equations 4 and 5 may be solved for the distance b (e.g., 216) and the current I through the wire (e.g., 205). The distances a and c can be known from the placement of the sensors 203a, 203b, 210, and 212. As noted above, b can vary depending on a particular wire 205 placed in the opening 220. Thus, one way of accurately measuring current flowing through a wire 205 positioned in the opening 220 that can account for varying placements of a center point of different wires in the vertical dimension shown in FIG. 2A has been provided.

According to some other implementations, when the distances 207 and 208 are not approximately equal to each other, the difference in these distances can be accounted for by applying an adjustment, such as a scale factor, to a signal generated by at least one of the magnetic sensors 203a, 203b. In an embodiment in which the distances 207 and 208 are not approximately equal to each other, the location of a selected point of the wire 205 in both dimensions may be determined based on data from the magnetic sensors 203a, 203b and the secondary sensors 210, 212.

The processor 204 may be further configured to receive measurement signals from the secondary sensors 210, 212. The secondary sensors 210, 212 may also generate outputs that include interference from the surrounding environment, and the interference may be cancelled out by taking the difference between the signals from the secondary sensors 210, 212. Furthermore, since the magnetic field around a current-carrying wire drops off inversely with distance, the location of the wire 205 in the second dimension (e.g., the vertical or y-dimension in FIG. 2A) may be determined based on the differential signals from the magnetic sensors 203a, 203b and the secondary sensors 210, 212. The processor 204 may be configured to compare the differential signal from the magnetic sensors 203a, 203b and the differential signal from the sensors 210, 212 to determine the location of the wire 205 in the second dimension. For example, in an embodiment in which the distances 207 and 208 are approximately equal to each other, the distance 216 can be computed by solving Equations 4 and 5 as discussed above. In another embodiment in which the distances 207 and 208 are not approximately equal to each other, the distance 216 can be computed based on the equations below:

$$a' = a_1 + a_2 \quad \text{(Equation 6)}$$

$$H_1 = \frac{Ia_1}{2\pi r_1^2} + \frac{Ia_2}{2\pi r_2^2} = \frac{Ia_1}{2\pi(a_1^2 + b^2)} + \frac{Ia_2}{2\pi(a_2^2 + b^2)} \quad \text{(Equation 7)}$$

$$H_2 = \frac{Ia_1}{2\pi r_3^2} + \frac{Ia_2}{2\pi r_4^2} = \frac{Ia_1}{2\pi(a_1^2 + (c-b)^2)} + \frac{Ia_2}{2\pi(a_2^2 + (c-b)^2)} \quad \text{(Equation 8)}$$

where a' is the first dimension (e.g., x-dimension) distance between the sensor pairs (203a, 203b) and (210, 212), $a_1$ is the first dimension distance between the wire and the first magnetic sensor (e.g., the distance 207), $a_2$ is the first dimension distance between the wire and the second magnetic sensor (e.g., the distance 208), and $r_1$, $r_2$, $r_3$, and $r_4$ are the radial distances between the wire and the four sensors 203a, 203b, 210, and 212, respectively. Similar to the previous example in connection with Equations 4 and 5, from the placement of the sensors 203a, 203b, 210, and 212, the distances a', $a_1$, $a_2$, and c can be known, and two unknowns (the distance b (e.g., 216) and the current I through the wire (e.g., 205)) can be solved using two equations.

The processor 204 may be configured to determine the current flowing through the wire 205 based on the differential signal from the magnetic sensors 203a, 203b and the position of the wire in the second dimension, for example. The current flowing through the wire 205 can be determined based on Equations 1-8 discussed above. Therefore, the processor 204 may derive the current flowing through the wire 205 from the sensor data.

Referring to FIG. 2B, a cross-sectional diagram illustrating another example apparatus for measuring current will be described. The illustrated apparatus 250 may implement the current measuring unit 104 (FIG. 1). The apparatus 250 is substantially the same as the apparatus 200 (FIG. 2A) except that the secondary or vertical position sensors 210, 212 are replaced by secondary or vertical position sensing elements 218a, 218b, respectively.

The secondary sensing elements 218a, 218b may be configured to detect the location of the wire 205 positioned within the opening 220 in a second dimension (e.g., the vertical or y-dimension in FIG. 2B). The sensing elements 218a, 218b may be located along the walls of the opening 220 as illustrated in FIG. 2B. The secondary sensing elements 218a, 218b may be an infrared (IR) light emitting diode (LED) sensor set. Accordingly, the secondary sensing elements 218a, 218b can together be considered a single sensor. For example, one of the secondary sensing elements 218a may be an emitter of an IR LED sensor, and the other of the secondary sensing elements 218b may be a detector of the IR LED sensor, or vice versa. The secondary sensing elements 218a, 218b may also be tactile sensors. The secondary sensors 210, 212 (FIG. 2A) and/or the secondary sensing elements 218a, 218b may be implemented by any type of sensor(s) suitable to provide signals to the processor 204 from which a position of the wire 205 within the opening 220 in a dimension other than the first dimension can be determined by the processor 204.

The processor 204 may be in communication with the magnetic sensors 203a, 203b and the secondary sensing elements 218a, 218b. The signals from the magnetic sensors 203a, 203b may be processed by the processor 204 as discussed above in connection with FIG. 2A. The secondary sensing elements 218a, 218b may detect presence of the wire 205 at a portion of the wall along the opening 220. For example, the secondary sensing elements 218a, 218b may detect that in some part of the wall of the opening 220, the IR LED signal emitted from the emitter (e.g., 218b) is not detected by the detector (e.g., 218a). In another example, the secondary sensing elements 218a, 218b may detect that the wire 205 is in contact with one or both of the secondary sensing elements 218a, 218b at a certain point along the wall of the opening 220. The processor 204 may be configured to determine the location of a selected point of the wire 205 (e.g., the center point) based on the signals from the secondary sensing elements 218a, 218b indicating the presence and location of the wire 205 within the opening. The location of the wire 205 may be expressed as the distance between the magnetic sensors 203a, 203b and the center of the wire 205 in the second dimension (e.g., the y-dimension in FIG. 2B). The differential signal from the magnetic sensors 203a, 203b in conjunction with the location of the wire 205 in the second dimension may be used to derive the current through the wire 205 as discussed in above.

Figure 3:
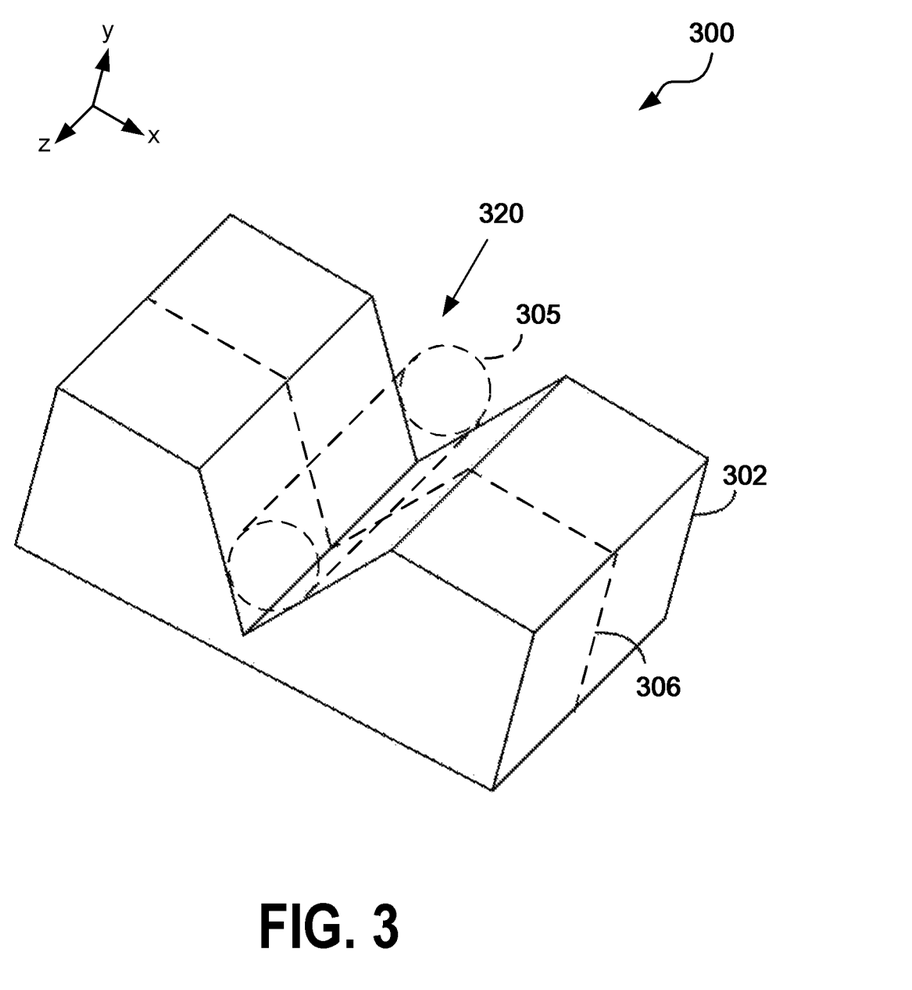
FIG. 3 is a three dimensional view of a portion of an example apparatus for measuring current in accordance with one embodiment.

Referring to FIG. 3, a three dimensional view of a portion of an example apparatus for measuring current will be described. The illustrated portion of the apparatus 300 includes a body 302 with an opening 320, which may receive a wire 305 and a cross-sectional plane 306. The wire 305 is not typically considered part of the apparatus 300. The body 302 and the opening 320 can implement any combination of features of the body 202 and the opening 220, respectively, of FIGS. 2A-2B. Although not shown, other elements, including the sensors and the processor, illustrated in FIGS. 2A-2B may be included in the apparatus 300, in some embodiments within the body 302. The illustrations in FIGS. 2A-2B may be along the cross-sectional plane 306, and the magnetic sensors 203a, 203b and the secondary sensors 210, 212, 218a, 218b of FIGS. 2A-2B may be located on the cross-sectional plane 306. Accordingly, firmly placing the wire 305 by pressing against the opening 320 at around the cross-sectional plane 306 may be advantageous for accurate current measurement.

Figure 4:
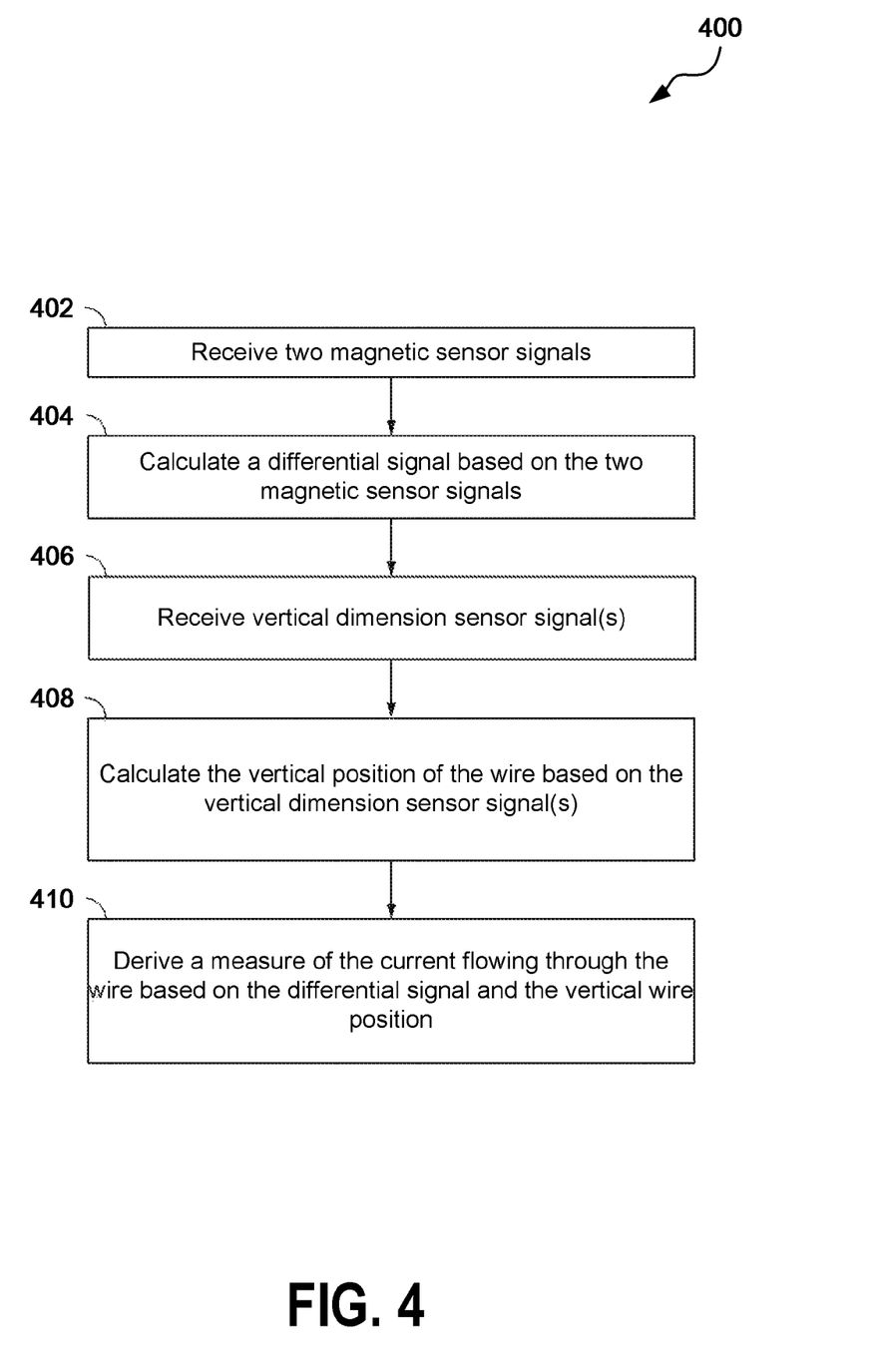
FIG. 4 is a flowchart of an example process for measuring current in accordance with one embodiment.

Referring to FIG. 4, a flowchart of an example process for measuring current will be described. The process 400 may be performed by, for example, the processor 108 (FIG. 1) and/or the processor 204 (FIGS. 2A and/or 2B). The process 400 may be implemented by the processor 108 and/or 204 in some embodiments. Some or all of the process 400 may be stored in a non-transitory computer-executable form in the memory 110, for example.

At block 402, sensor signals from two magnetic sensors may be received. The two magnetic sensors, such as the magnetic sensors 203*a*, 203*b* in FIGS. 2A-2B, may detect changes in resistance due to the magnetic field generated around the wire carrying current and generate sensor signals. The processor 204 (FIGS. 2A-2B) may receive these signals for further processing.

At block 404, a differential signal based on the two received sensor signals may be calculated. In some embodiments, the differential signal may be a simple difference between the two received sensor signals. As discussed in connection with FIG. 2A, the processor 204 may remove almost all common mode interference from the signals from the magnetic sensors 203*a*, 203*b* by calculating the differential signal from the received magnetic sensor signals from the magnetic sensors 203*a*, 203*b*.

At block 406, one or more vertical dimension sensor signals may be received. The processor 204 (FIGS. 2A-2B) may obtain the one or more vertical dimension sensor signals from the secondary sensors 210, 212 in FIG. 2A or the secondary sensors 218*a*, 218*b* in FIG. 2B.

At block 408, the vertical position of the wire may be determined based at least in part on the secondary sensor signals. In one embodiment, the processor 204 (FIG. 2A) may determine the position of the wire in the second dimension (e.g., the vertical or y-dimension in FIG. 2A) by comparing the differential signal from the magnetic sensors 203*a*, 203*b* and the differential signal from the secondary sensors 210, 212 as discussed in connection with FIG. 2A. In another embodiment, the processor 204 (FIG. 2B) may determine the position of the wire in the second dimension (e.g., the vertical or y-dimension in FIG. 2B) by determining the vertical location of the wire from the signals from the secondary sensors 218*a*, 218*b* as discussed in connection with FIG. 2B.

At block 410, the current through the wire may be determined based on the differential signal of the first sensor set and the vertical position of the wire. The processor may derive the current through the wire from the differential signal from the magnetic sensors 203*a*, 203*b* and the position of the wire in the second dimension (e.g., the vertical or y-dimension in FIGS. 2A-2B) determined at the previous block. This can involve performing one or more computations discussed above.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Applications

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. An apparatus for measuring current flowing through a wire, the apparatus comprising:
   a housing with an opening comprising a sloped recess, wherein the opening is configured to receive the wire in a direction substantially in a dimension;
   two magnetic sensors within the housing;
   another one or more sensors; and
   a processor in communication with the two magnetic sensors and the another one or more sensors, the processor configured to derive a measure of the current flowing through the wire based on outputs of the two magnetic sensors and a determined location of the point of the wire in the dimension, the determined location being based on an output of the another one or more sensors.

2. The apparatus of claim 1, wherein the dimension is a second dimension, and wherein the opening has a shape that defines a location of a point of the wire in a first dimension when the wire is positioned in the opening.

3. The apparatus of claim 2, wherein the opening is configured to define the same location of a center point of the wire in the first dimension independent of the width of the wire.

4. The apparatus of claim 2, wherein the point of the wire is a center point of the wire, and wherein the two magnetic sensors are approximately equal distance from the center point of the wire in the first dimension.

5. The apparatus of claim 2, wherein the processor is configured to:
determine a distance between the point of the wire and at least one of the two magnetic sensors based on the defined location of the point of the wire in the first dimension and the determined location of the point of the wire in the second dimension;
wherein the processor is configured to derive the measure of the current based on the determined distance.

6. The apparatus of claim 2, wherein the two magnetic sensors are positioned on opposing sides of the opening in the first dimension.

7. The apparatus of claim 1, wherein at least a portion of the opening is substantially V-shaped.

8. The apparatus of claim 1, wherein the dimension is a second dimension, and wherein the two magnetic sensors are disposed in a plane along a first dimension.

9. The apparatus of claim 1, wherein the processor is configured to:
determine an alternating current (AC) measure of current flowing through the wire; and
determine a direct current (DC) measure of current flowing through the wire.

10. The apparatus of claim 1, wherein the two magnetic sensors are anisotropic magnetoresistance (AMR) sensors.

11. The apparatus of claim 10, wherein the another one or more sensors comprise anisotropic magnetoresistance (AMR) sensors positioned on an opposite side of a plane perpendicular to the current through the wire than the two magnetic sensors.

12. The apparatus of claim 1, wherein at least one of the processor or the additional one or more sensors are within the housing.

13. The apparatus of claim 12, wherein the housing comprises a contact configured to output the measure of current flowing through the wire.

14. The apparatus of claim 1, wherein the processor is further configured to generate a differential signal indicative of a difference between the outputs of the two magnetic sensors, and wherein the measure of the current is based on the differential signal and the determined location of the point of the wire in the second dimension.

15. The apparatus of claim 1, wherein the opening is configured such that a length of the wire extends along a different dimension than the dimension when the wire is positioned in the opening.

16. A method for measuring current through a wire, the method comprising:
receiving outputs of two magnetic sensors
determining a location of a point of the wire in a dimension based on an output of another one or more sensors, wherein the wire is positioned in an opening such that a length of the wire extends along a different dimension than the dimension, and wherein the opening is configured to receive the wire in a direction substantially in the dimension; and
deriving a measure of the current flowing through the wire based on the outputs of the two magnetic sensors and the determined location of the point of the wire in the dimension.

17. The method of claim 16, wherein the dimension is a second dimension, and wherein the opening defines a location of the wire in a first dimension.

18. The method of claim 16, wherein the point of the wire is a center point, wherein the dimension is a second dimension, and wherein the two magnetic sensors are approximately equal distance from the center point of the wire in a first dimension.

19. The method of claim 16, wherein the deriving the measure of the current through the wire comprises deriving a direct current (DC) measure.

20. The method of claim 17, wherein the deriving includes determining distances between the point of the wire and the two magnetic sensors based on the defined location of the point of the wire in the first dimension and the determined location of the point of the wire in the second dimension.

21. The method of claim 16, wherein the opening comprises a sloped recess.

22. The method of claim 16, further comprising generating a differential signal indicative of a difference between the outputs of the two magnetic sensors, wherein the deriving is based on the differential signal and the determined location of the point of the wire.

23. An apparatus for measuring current flowing through a wire, the apparatus comprising:
a body with a recess configured to receive and fix a horizontal position of the wire when the wire is positioned in the recess;
two magnetic sensors positioned on opposing horizontal sides of the recess;
at least one vertical position sensor configured to measure a vertical position of the wire when the wire is positioned in the recess; and
a processor in communication with the two magnetic sensors and the at least one vertical position sensor, the processor configured to calculate a current flowing through the wire based on outputs of the two magnetic sensors and the at least one vertical position sensor.

24. An apparatus for measuring current flowing through a wire, the apparatus comprising:
a housing with an opening configured to receive the wire and to define a location of a point of the wire in a first dimension when the wire is positioned in the opening, wherein the opening comprises a recess;
two magnetic sensors within the housing positioned on opposing sides of the opening in the first dimension;
another one or more sensors; and
a processor in communication with the two magnetic sensors and the another one or more sensors, the processor configured to:
generate a differential signal indicative of a difference between outputs of the two magnetic sensors;
determine a location of the point of the wire in a second dimension based on an output of the another one or more sensors; and
derive a measure of the current flowing through the wire based on the differential signal and the determined location of the point of the wire in at least the second dimension.

25. The apparatus of claim 24, wherein the opening is arranged to receive the wire from a direction substantially in the second dimension.

\* \* \* \* \*